(12) United States Patent
Xu et al.

(10) Patent No.: US 10,503,954 B2
(45) Date of Patent: Dec. 10, 2019

(54) PHOTOSENSITIVE MODULE, PHOTOSENSITIVE DEVICE AND DISPLAY PANEL

(71) Applicant: BOE TECHNOLOGY GROUP CO., LTD., Beijing (CN)

(72) Inventors: Rui Xu, Beijing (CN); Haisheng Wang, Beijing (CN); Yingming Liu, Beijing (CN); Pinchao Gu, Beijing (CN); Changfeng Li, Beijing (CN); Xueyou Cao, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 15/953,431

(22) Filed: Apr. 14, 2018

(65) Prior Publication Data
US 2019/0065812 A1  Feb. 28, 2019

(30) Foreign Application Priority Data

Aug. 23, 2017 (CN) .............................. 201710731265
Aug. 23, 2017 (CN) .............................. 201710731747

(51) Int. Cl.
| G06K 9/00 | (2006.01) |
| F21V 8/00 | (2006.01) |
| H01L 27/146 | (2006.01) |

(52) U.S. Cl.
CPC .......... *G06K 9/0004* (2013.01); *G02B 6/0016* (2013.01); *G02B 6/0023* (2013.01); *G02B 6/0035* (2013.01); *G06K 9/00046* (2013.01); *H01L 27/14625* (2013.01)

(58) Field of Classification Search
None
See application file for complete search history.

(56) References Cited

U.S. PATENT DOCUMENTS

| 4,728,186 A * | 3/1988 | Eguchi ..................... G02B 6/26 356/448 |
| 5,619,586 A * | 4/1997 | Sibbald .............. G06K 9/00046 356/71 |
| 5,986,746 A * | 11/1999 | Metz .................... A61B 5/1172 356/71 |
| 7,149,385 B2 * | 12/2006 | Parikka ................ G02B 6/1221 385/37 |
| 7,949,214 B2 * | 5/2011 | DeJong .............. G02B 27/0081 385/31 |
| 2006/0119837 A1 * | 6/2006 | Raguin ............... G06K 9/00046 356/71 |

(Continued)

*Primary Examiner* — Lex H Malsawma
(74) *Attorney, Agent, or Firm* — Calfee, Halter & Griswold LLP

(57) ABSTRACT

A photosensitive module includes a plurality of photosensitive cells. Each of the photosensitive cells includes a selective light director having a first surface including a light entry region and a light exit region different from the light entry region, the selective light director being configured to selectively direct a collimated portion of light incident towards the light entry region to the light exit region to exit from the selective light director; and a photoelectric converter arranged in the light exit region and having a light receiving surface facing the light exit region to receive the collimation portion of the light exiting from the selective light director.

20 Claims, 6 Drawing Sheets

(56) References Cited

U.S. PATENT DOCUMENTS

| | | | |
|---|---|---|---|
| 2008/0284925 A1* | 11/2008 | Han | G06F 3/0425 349/12 |
| 2013/0119237 A1* | 5/2013 | Raguin | H01L 27/14601 250/208.1 |
| 2015/0010265 A1* | 1/2015 | Popovich | G02F 1/13342 385/10 |
| 2016/0132712 A1* | 5/2016 | Yang | G06K 9/0002 348/77 |
| 2016/0224816 A1* | 8/2016 | Smith | G02B 27/58 |
| 2016/0266695 A1* | 9/2016 | Bae | G06F 1/1643 |
| 2017/0220838 A1* | 8/2017 | He | G06K 9/0004 |
| 2017/0255813 A1* | 9/2017 | Chen | G02B 5/32 |
| 2017/0270342 A1* | 9/2017 | He | G06F 3/0412 |
| 2017/0323144 A1* | 11/2017 | Wu | G06K 9/0004 |
| 2018/0018492 A1* | 1/2018 | Vilenskii | G06K 9/0004 |
| 2018/0349673 A1* | 12/2018 | Lin | G06K 9/00046 |
| 2019/0065813 A1* | 2/2019 | Xu | G06K 9/0004 |

\* cited by examiner

PHOTOSENSITIVE MODULE, PHOTOSENSITIVE DEVICE AND DISPLAY PANEL

CROSS-REFERENCE TO RELATED APPLICATIONS

This application claims the benefit of Chinese Patent Applications No. 201710731265.2 and No. 201710731747.8 filed on Aug. 23, 2017, the entire disclosures of which are incorporated herein by reference.

TECHNICAL FIELD

The present disclosure relates to the field of photoelectric technologies, and in particular to a photosensitive module, a photosensitive device, and a display panel.

BACKGROUND

Fingerprint recognition technology has been widely used in electronic devices. For example, a smart phone may be provided with a light source and a plurality of photosensitive elements for fingerprint recognition at its home key. Specifically, the light source and the photosensitive elements are disposed below the cover plate. The cover plate usually requires an opening at the position corresponding to the home key in order to accommodate the plurality of photosensitive elements. The opening narrows the distance between the photosensitive elements and the finger, thereby improving the accuracy of fingerprint recognition. However, providing the opening involves cutting the cover plate (typically made of glass), which may easily lead to cracking of the cover plate. Therefore, a higher level of process is required and the cost is increased.

SUMMARY

It would be advantageous to provide a solution that may alleviate, mitigate or eliminate one or more of the above problems.

According to an aspect of the disclosure, a photosensitive module is provided comprising: a plurality of photosensitive cells each comprising: a selective light director having a first surface, the first surface comprising a light entry region and a light exit region different from the light entry region, the selective light director being configured to selectively direct a collimated portion of light incident towards the light entry region to the light exit region to exit from the selective light director, the collimated portion of the light having an incidence angle with respect to a normal to the first surface that is less than a threshold; and a photoelectric converter arranged in the light exit region and having a light receiving surface facing the light exit region to receive the collimated portion of the light exiting from the selective light director, the photoelectric converter being configured to generate an electrical signal based on an intensity of the received collimated portion of the light.

In some exemplary embodiments, the photosensitive module further comprises a light source arranged to emit light in a direction away from the first surface of the selective light director.

In some exemplary embodiments, the photosensitive module further comprises a processor configured to receive the electrical signal from at least a portion of the photosensitive cells and generate an image from the received electrical signals.

In some exemplary embodiments, the selective light director comprises: an optical waveguide plate providing the first surface; a first holographic diffraction grating arranged in the light entry region for coupling the collimated portion of the light into the optical waveguide plate such that the collimated portion of the light propagates within the optical waveguide plate to the light exit region; and a second holographic diffraction grating arranged in the light exit region for coupling the collimated portion of the light propagating to the light exit region out of the optical waveguide plate.

In some exemplary embodiments, each of the photosensitive cells further comprises a collimator comprising at least one light transmission channel, and the collimator is arranged on the first holographic diffraction grating to allow substantially only the collimated portion of the light incident towards the light entry region to pass through the at least one light transmission channel to be incident on the first holographic diffraction grating.

In some exemplary embodiments, the collimator comprises a plurality of light absorbing strips parallel to and spaced apart from one other, and the light absorbing strips are arranged parallel to the normal to the first surface such that a gap between each two directly adjacent ones of the light absorbing strips forms a corresponding one of the light transmission channels.

In some exemplary embodiments, the collimator comprises a first light absorbing plate and a second light absorbing plate parallel to and spaced apart from each other, the first light absorbing plate and the second light absorbing plate are arranged perpendicular to the normal to the first surface and are each provided with at least one opening extending in a direction parallel to the normal, and the at least one opening of the first light absorbing plate and the at least one opening of the second light absorbing plate are aligned in a direction parallel to the normal to form the at least one light transmission channel.

In some exemplary embodiments, at least a portion of the plurality of photosensitive cells is formed in one piece.

In some exemplary embodiments, the selective light directors of the plurality of photosensitive cells are spaced apart from one another.

In some exemplary embodiments, the photoelectric converter is provided, at an outer surface thereof other than the light receiving surface, with a light shielding layer.

In some exemplary embodiments, each of the photosensitive cells further comprises a switch transistor arranged on a side of the photoelectric converter away from the selective light director.

In some exemplary embodiments, the switch transistor comprises an active layer and a light shielding block covering the active layer to protect the active layer from the collimated portion of the light exiting from the selective light director.

According to another aspect of the disclosure, a photosensitive device is provided comprising the photosensitive module as described above.

According to yet another aspect of the disclosure, a display panel is provided comprising: a base substrate on which a plurality of pixel units are provided; a cover plate disposed opposite to the base substrate; and a photosensitive module disposed between the base substrate and the cover plate. The photosensitive module comprises a plurality of photosensitive cells each comprising: a selective light director having a first surface, the first surface comprising a light entry region and a light exit region different from the light entry region, the selective light director being configured to selectively direct a collimated portion of light incident towards the light entry region to the light exit region to exit from the selective light director, the collimated portion of the light having an incidence angle with respect to a normal to the first surface that is less than a threshold; and a photoelectric converter arranged in the light exit region and having a light receiving surface facing the light exit region to receive the collimated portion of the light exiting from the selective light director, the photoelectric converter being configured to generate an electrical signal based on an intensity of the received collimated portion of the light. The photosensitive module is arranged such that the first surface of the selective light director faces the cover plate.

In some exemplary embodiments, the photosensitive module further comprises a light source configured to emit light in a direction away from the first surface of the selective light director.

In some exemplary embodiments, the photosensitive module is disposed within a display area of the display panel where the pixel units are provided, and the light source, the pixel units and the photoelectric converters are arranged on the first surfaces of the selective light directors.

In some exemplary embodiments, the photosensitive module is disposed within a display area of the display panel where the pixel units are provided. Each of the pixel units is an organic light emitting diode pixel unit comprising an organic light emitting diode. First ones of the pixel units are disposed above respective ones of the photosensitive cells such that the organic light emitting diodes of the first pixel units emit light in a direction away from the first surfaces of the selective light directors.

These and other aspects of the present disclosure will be apparent from and elucidated with reference to the embodiment(s) described hereinafter.

BRIEF DESCRIPTION OF THE DRAWINGS

Further details, features and advantages of the disclosure are disclosed in the following description of exemplary embodiments in connection with the accompanying drawings, in which.

DETAILED DESCRIPTION

Figure 1:
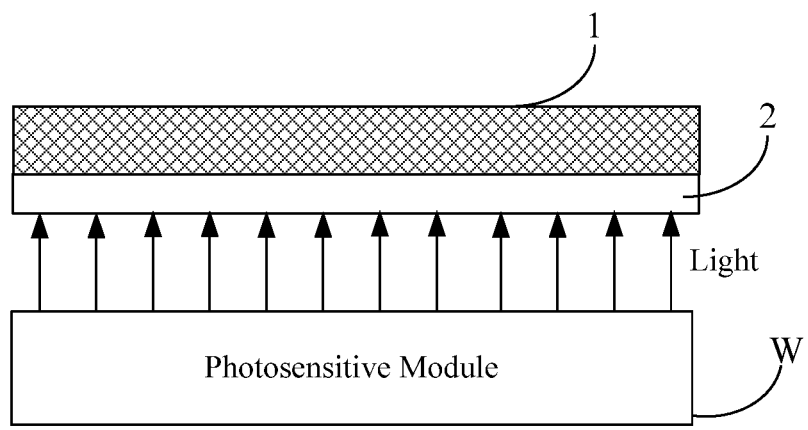
FIG. 1 is a schematic diagram showing a scenario in which a photosensitive module according to an embodiment of the present disclosure is used.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings. Like reference numerals refer to like elements throughout.

FIG. 1 is a schematic diagram showing a scenario in which a photosensitive device according to an embodiment of the present disclosure is used. As shown in FIG. 1, a photosensitive device W emits light towards an object 1, detects an intensity of the light reflected by various portions of the object 1, and generates an image of the object 1 based on the detected intensity of the light. In an application scenario of fingerprint recognition where the object 1 is a finger, the photosensitive device W is further equipped with a cover plate 2. The finger 1 is in contact with one side of the cover plate 2, and the photosensitive device W is provided on the other side of the cover plate 2 to image the fingerprint of the finger 1. Since the fingerprint of the finger 1 has a plurality of valleys (recesses) and a plurality of ridges (bumps), the photosensitive device W will receive light having different intensities that is reflected by the valleys and ridges, and generate a plurality of electric signals having different intensities. These electrical signals can be used to determine the valleys and ridges in the fingerprint, achieving recognition of the fingerprint. The photosensitive device W may be any device equipped with fingerprint recognition capabilities such as, for example, a smart phone, a time attendance machine, a notebook computer, etc. The photosensitive device W may even be used for other purposes e.g., face recognition.

Figure 2:
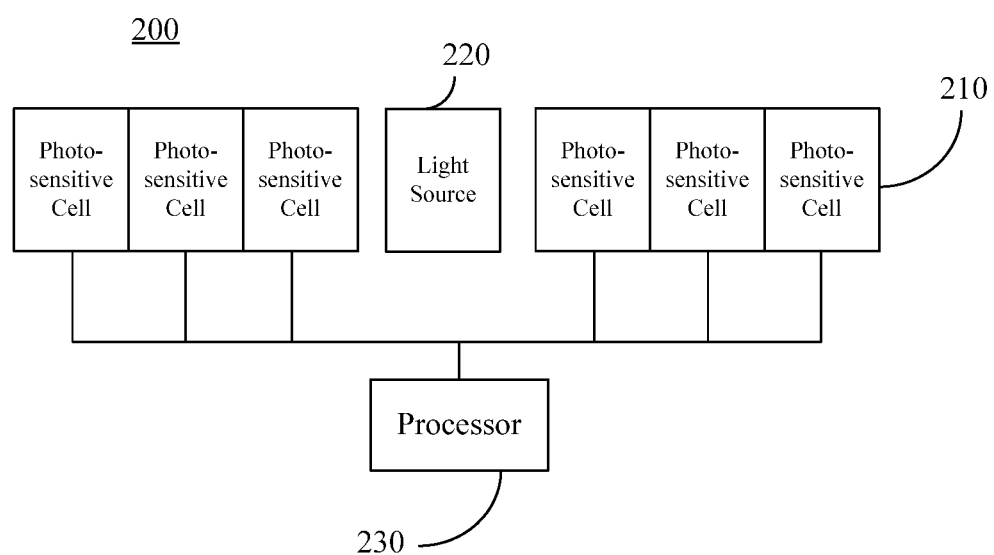
FIG. 2 is a block diagram of a photosensitive module according to an embodiment of the present disclosure.

FIG. 2 is a block diagram of a photosensitive module 200 according to an embodiment of the present disclosure. The photosensitive module 200 is an integral part of the photosensitive module W shown in FIG. 1 and includes a plurality of photosensitive cells 210 for detecting the intensity of light reflected by the object 1 and generating an electrical signal. The photosensitive cells 210 may be arranged in an array. The photosensitive module 200 may optionally include at least one light source 220 arranged to emit light towards the object 1, which light is then reflected by the object 1 back to the plurality of photosensitive cells 210. Examples of the light source 220 include, but are not limited to, an organic light emitting diode (OLED), a light emitting diode (LED), a Micro-LED, an infrared emitter, or other light sources. The light source 220 may operate as a "point light source" and thus may emit light with a selected directionality. This provides advantages as described later. In the example of FIG. 2, the photosensitive module 200 optionally includes a processor 230 configured to receive the electrical signals from at least a portion of the photosensitive cell 210 and generate an image from the received electrical signals.

Figure 3:
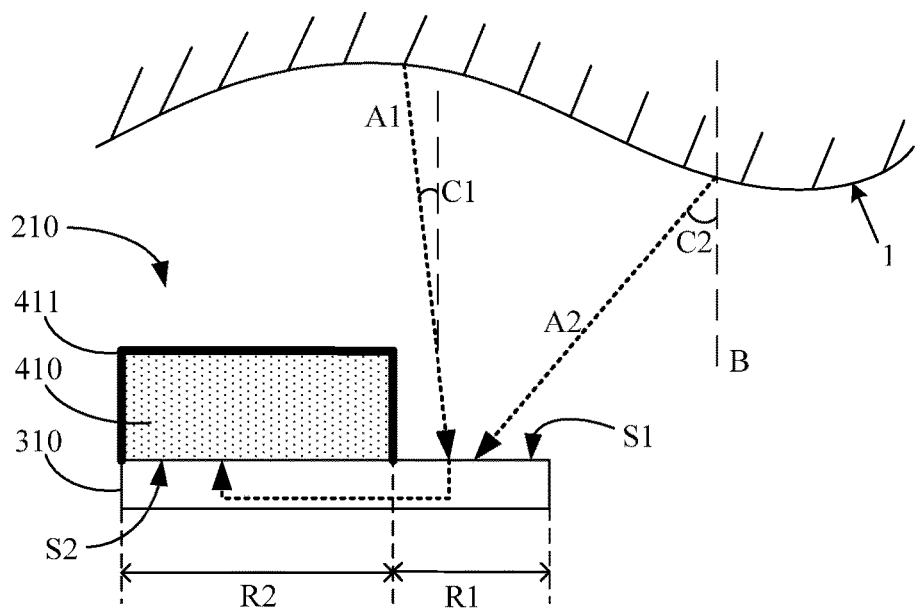
FIG. 3 is a cross-sectional view schematically showing a structure of a photosensitive cell shown in FIG. 2.

FIG. 3 schematically shows the structure of the photosensitive cell 210 shown in FIG. 2. As shown in FIG. 3, the photosensitive cell 210 includes a selective light director 310 and a photoelectric converter 410.

The selective light director 310 has a first surface S1 (upper surface in the example of FIG. 3) including a light entry region R1 and a light exit region R2 different from the light entry region R1. Although the light entry region R1 and the light exit region R2 are shown in FIG. 3 as being directly adjacent, this is not required. In operation, the light source 220 shown in FIG. 2 may be arranged on the first surface S1 of the selective light director 310 and emit light in a direction away from the first surface S1, which light is then reflected by the object 1. When the reflected light (for example, light A1 and A2) is incident in the light entry region R1, the selective light director 310 selectively directs a collimated portion (for example, light A1) of the reflected light to the light exit region R2 to exit from the selective light director 310. The term collimated light as used herein means that the light has an incidence angle with respect to a normal B of the first surface S1 that is less than a threshold. In the example of FIG. 3, the light A1 has a small incidence angle C1 (specifically, smaller than the threshold) with respect to the normal B of the first surface S1, and thus may be referred to as collimated light; the light A2 has a large incidence angle C2 (specifically, larger than the threshold) with respect to the normal B of the first surface S1, and therefore may be referred to as non-collimated light. As will be further explained below, the selective light director 310 exhibits angular selectivity in that the collimated light A1 incident to the light entry region R1 will be directed by the selective light director 310 to the light exit region R2, whereas the non-collimated light A2 will not.

The photoelectric converter 410 is arranged in the light exit region R2. The photoelectric converter 410 has a light receiving surface S2 facing the light exit region R2 to receive the collimated light exiting from the light exit region R2. The photoelectric converter 410 is configured to generate an electrical signal based on the intensity of the received collimated light. It will be understood that the collimated light exiting from the light exit region R2 here does not necessarily have an incident angle with respect to the normal B of the first surface S1 that is smaller than the threshold. That is, the collimated light exiting from the light exit region R2 is not necessarily the "collimated light" as previously defined herein.

Due to the angular selectivity of the selective light director 310, when the distance between the photosensitive cell 210 and the object 1 is relatively large, the photosensitive cell 210 can still receive collimated light with a small degree of scattering. This allows the photosensitive cell 210 to be disposed directly below the cover without cutting the cover plate for an opening, reducing the difficulty of the manufacturing process. Moreover, since the light received by the photoelectric converter 410 is the light reflected by the portion of the object 1 located directly above the photosensitive cell 210 and does not include the light reflected by the portion of the object 1 located obliquely above the photosensitive cell 210, the electrical signal generated by the photoelectric converter 410 is only related to the portion of the object 1 directly above the photosensitive cell 210, thus improving the accuracy of the resulting image.

Still referring to FIG. 3, in some embodiments, a portion of the outer surface of the photoelectric converter 410 other than the light receiving surface S2 may be provided with a light shielding layer 411. In other words, the photoelectric converter 410 is opaque to light except for the light receiving surface S2. This allows only light from the selective light director 310 to enter the photoelectric converter 410, avoiding interference from other stray light.

Figure 4:
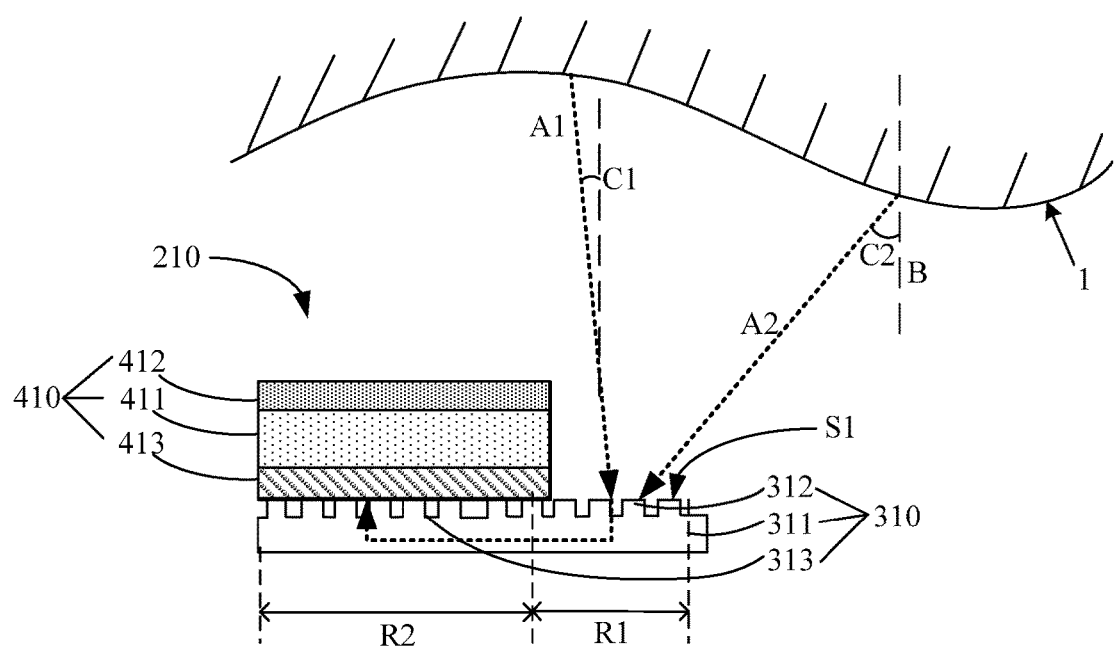
FIG. 4 is a cross-sectional view schematically showing an example configuration of the photosensitive cell of FIG. 3.

FIG. 4 schematically shows an example configuration of the photosensitive cell 210 of FIG. 3. As shown in FIG. 4, the selective light director 310 includes an optical waveguide plate 311 providing the first surface S1, a first holographic diffraction grating 312 disposed in the light entry region R1, and a second holographic diffraction grating 313 disposed in the light exit region R2. Although the first holographic diffraction grating 312 and the second holographic diffraction grating 313 are shown in FIG. 4 as being directly adjacent, this is not required. The holographic gratings 312 and 313 each include a plurality of scribes that are tilted at a particular angle. It is known that due to the Bragg diffraction condition, holographic gratings have very strict requirements on the angle of incident light when performing optical coupling. That is, a holographic grating with scribes that are inclined at an angle responds only to incident light in a small range of angles and will couple it into the grating, while the rest of the incident light will not be coupled and instead will directly transmit through the grating. This therefore provides the angular selectivity to the selective light director 310. Specifically, due to a diffractive effect of the first holographic diffraction grating 312, the collimated light A1 is coupled into the optical waveguide plate 311 and its propagation direction is changed to satisfy a total internal reflection condition, and the non-collimated light A2 simply transmits through the first holographic diffraction grating 312 and the optical waveguide plate 311. Then, the collimated light A1 propagates within the optical waveguide plate 311 and reaches the second holographic diffraction grating 313 where the total internal reflection condition is broken. Therefore, the collimated light A1 exits from the selective light director 310 via the second holographic diffraction grating 313. Although the optical waveguide plate 311, the first holographic diffraction grating 312, and the second holographic diffraction grating 313 are separately described herein, they may be formed in one piece. For example, in some embodiments, the entire selective light director 310 is formed as a thin film layer (having a Nano-scale thickness, for example). This allows the sum of the thicknesses of the selective light director 310 and the photoelectric converter 410 to be less than 100 microns.

Still referring to FIG. 4, the photoelectric converter 410 may be a photodiode that includes a photoelectric conversion layer 411, a light shielding electrode 412, and a light transmitting electrode 413. The light shading electrode 412 is an opaque electrode, and the light transmitting electrode 413 is a transparent electrode. Examples of the photodiode include, but are not limited to, PIN type photodiodes and organic photodiodes (OPDs). In other embodiments, the photoelectric converter 410 may also take other forms.

Figure 5:
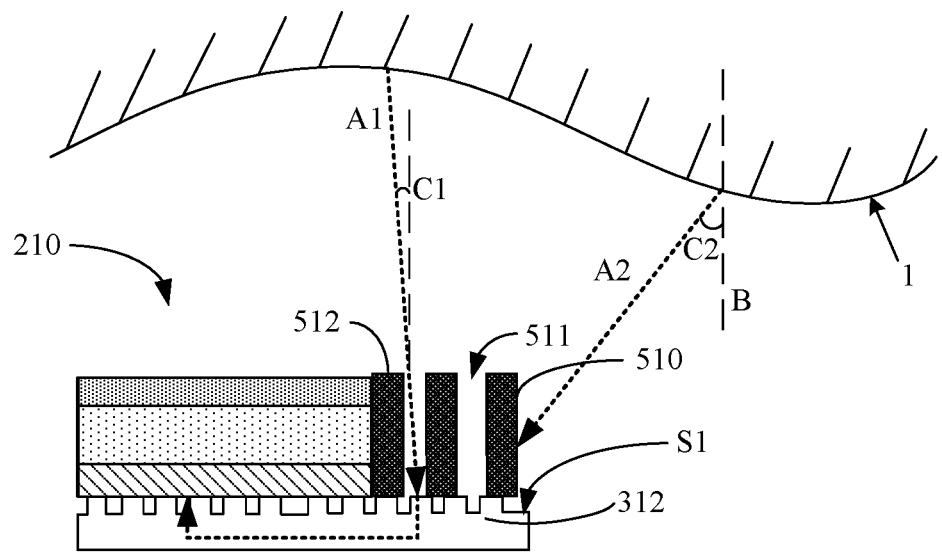
FIG. 5 is a cross-sectional view schematically showing another example configuration of the photosensitive cell of FIG. 3.

FIG. 5 schematically shows another example configuration of the photosensitive cell 210 of FIG. 3. As shown in FIG. 5, the photosensitive cell 210, on the basis of FIG. 3, further includes a collimator 510 including at least one light transmission channel 511. The collimator 510 is disposed on the first holographic diffraction grating 312 to allow substantially only collimated light (for example, the light A1) to pass through the at least one light transmission channel 511 to be incident on the first holographic diffraction grating 312. The term "substantially" here means that the possibility is not excluded that a small amount of non-collimated light also passes through the light transmission channel 511 due to, for example, manufacturing errors of the collimator 510 or the material from which the collimator 510 is made.

Specifically, collimator 510 includes a plurality of light absorbing strips 512 that are parallel to and spaced apart from one another. The light absorbing strips 512 are arranged parallel to the normal B of the first surface S1, and a gap between each two directly adjacent ones of the light absorbing strips 512 forms the light transmission channel 511. Each of the light absorbing strips 512 includes any suitable light absorbing material to absorb the light impinging thereon. The non-collimated light A2 reflected by the object 1 impinges on the light absorbing strips 512 and is absorbed by the light-absorbing strips 512 so as not to pass through the light transmission channel 511. The collimated light A1 reflected by the object 1 enters the light transmission channel 511 between two light absorbing strips 512 so as to reach the first holographic diffraction grating 312.

Figure 6:
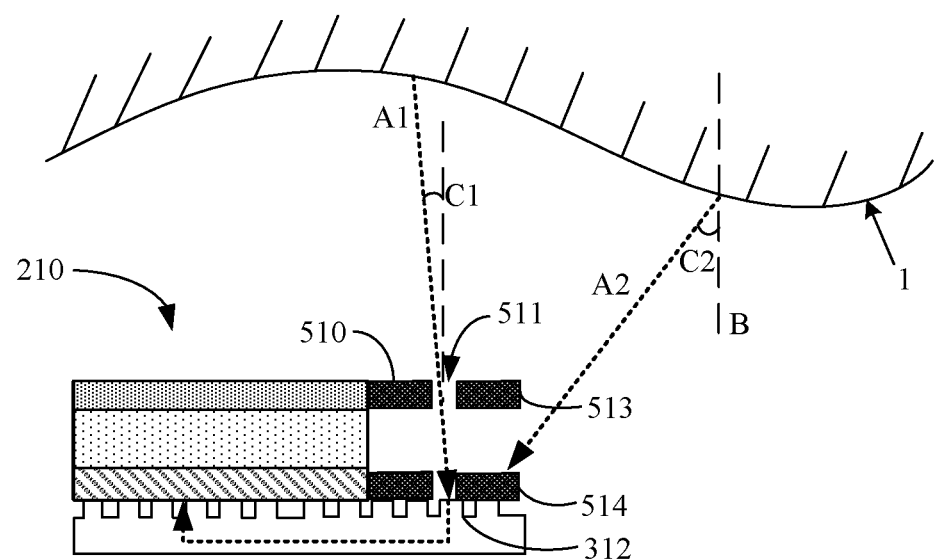
FIG. 6 is a cross-sectional view schematically showing yet another example configuration of the photosensitive cell of FIG. 3.

FIG. 6 schematically shows still another example configuration of the photosensitive cell 210 of FIG. 3. As shown in FIG. 6, the collimator 510 includes a first light absorbing plate 513 and a second light absorbing plate 514 that are parallel to and spaced apart from each other. The first light absorbing plate 513 and the second light absorbing plate 514 are arranged perpendicular to the normal line B of the first surface S1 and are each provided with at least one opening extending in a direction parallel to the normal B. The opening of the first light absorbing plate 513 and the opening of the second light absorbing plate 514 are aligned in a direction parallel to the normal B to form the light transmission channel 511. Each of the first light absorbing plate 513 and the second light absorbing plate 514 may include any suitable light absorbing material to absorb light impinging thereon. The non-collimated light A2 reflected by the object 1 impinges on the light absorbing plates and is absorbed so that it cannot pass through the light transmission channel 511. The collimated light A1 reflected by the object 1 enters the light transmission channel 511 and reaches the first holographic diffraction grating 312.

It will be understood that in the photosensitive cell embodiments shown in FIGS. 5 and 6, the side of the photoelectric converter directly adjacent to the collimator 510 may not need to be provided with a light shielding layer because the collimator 510 itself can serve as a shielding layer. It will also be understood that where the light source 220 (FIG. 2) operates as a "point light source", the collimator 510 may not be necessary because the point light source may be arranged to emit light having a selected directionality such that a large part of the light incident on the first holographic diffraction grating 312 is collimated light.

Figure 7:
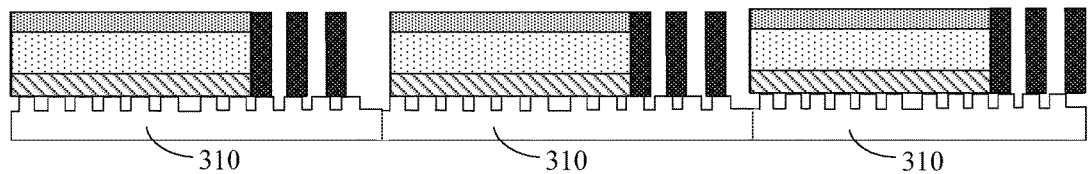
FIG. 7 is a partial sectional view of a photosensitive module according to an embodiment of the present disclosure.

FIG. 7 is a partial sectional view of a photosensitive module 700 according to an embodiment of the present disclosure. Three photosensitive cells are shown in FIG. 7, each of which takes the form shown in FIG. 5. In the photosensitive module 700, selective light directors 310 of these photosensitive cells are formed in one piece. This may facilitate the simplification of the manufacturing process. Although these photosensitive cells are shown as taking the form shown in FIG. 5, the present disclosure is not limited thereto.

Figure 8:
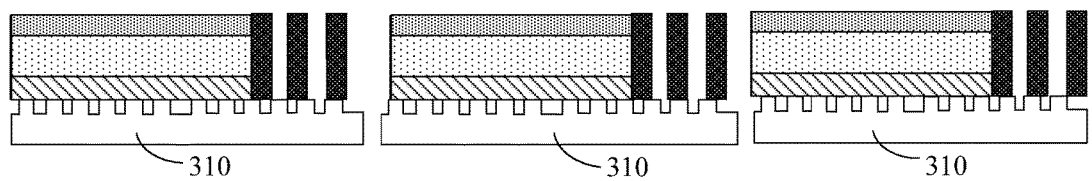
FIG. 8 is a partial sectional view of a photosensitive module according to an embodiment of the present disclosure.

FIG. 8 is a partial sectional view of a photosensitive module 800 according to an embodiment of the present disclosure. Three photosensitive cells are shown in FIG. 8, each of which also takes the form shown in FIG. 5, although the present disclosure is not limited thereto. In the photosensitive module 800, the selective light directors 310 of these photosensitive cells are spaced apart from one other. This may provide design flexibility for the photosensitive module.

Figure 9A:
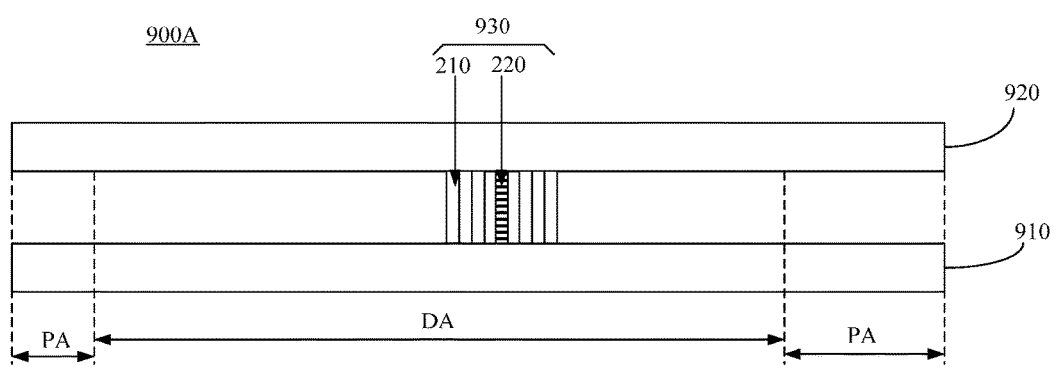
FIG. 9A is a cross-sectional view of a display panel according to an embodiment of the present disclosure.

FIG. 9A is a sectional view of a display panel 900A according to an embodiment of the present disclosure. As shown in FIG. 9A, the display panel 900A includes a base substrate 910, a cover plate 920 disposed opposite to the base substrate 910, and a photosensitive module 930 and a plurality of pixel units (not shown in FIG. 9A) that are disposed between the base substrate 910 and the cover plate 920. In the example of FIG. 9A, the photosensitive module 930 is disposed in a display area DA between the base substrate 910 and the cover plate 920. The display area DA of a display panel refers to an area of the display panel where pixel units are arranged, which occupies most of the area of the display panel. In contrast, a non-display area PA of the display panel refers to an area of the display panel where no pixel units are arranged, which is generally located at the periphery of the display area DA. The photosensitive module 930 includes a plurality of photosensitive cells 210 and optionally at least one light source 220. The photosensitive cell 210 may take the form of any one of the photosensitive cell embodiments described above. It will be understood that the arrangement of the plurality of photosensitive cells 210 is exemplary and illustrative in FIG. 9A, and that the photosensitive cells 210 may be distributed across the entire display area DA in other embodiments. The light source 220 may be a dedicated light source, such as e.g. a Micro-LED. Alternatively or additionally, some of the pixel units may serve as the light sources 220 of the photosensitive module 930, as will be described later. The use of dedicated light source(s) 220 may be advantageous compared to the case where the pixel units act as light sources (i.e., a "plane light source") in that the dedicated light source 220 operates as a "point light source" and thus may emit light with a selected directionality, making it possible to eliminate the need for the collimators in the photosensitive module 930. The dedicated light source 220 may be configured to emit light in an invisible spectrum and/or emit light in a time division manner with the pixel units in order to avoid disturbing the display effect of the display panel.

Figure 9B:
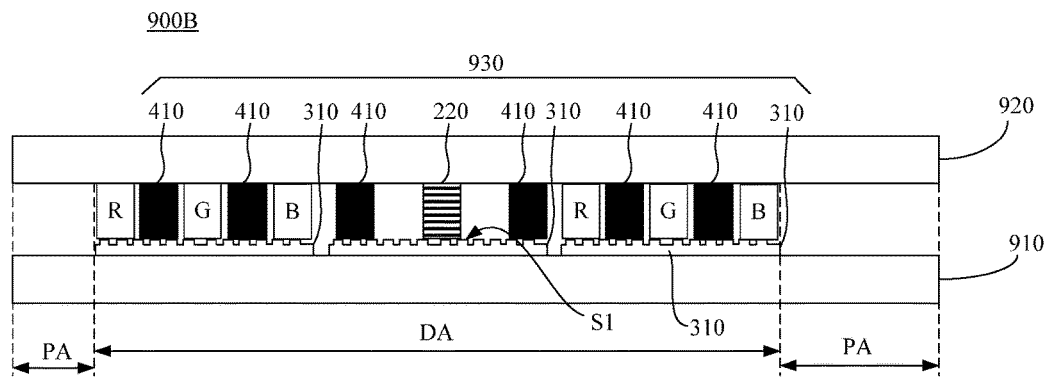
FIG. 9B is a cross-sectional view of a display panel according to an embodiment of the present disclosure.

FIG. 9B is a cross-sectional view of a display panel 900B according to an embodiment of the present disclosure. Similar to the display panel 900A shown in FIG. 9A, the display panel 900B includes a base substrate 910, a cover plate 920, and a photosensitive module 930 and a plurality of pixel units R, and B disposed within the display area DA between the base substrate 910 and the cover plate 920. The photosensitive module 930 includes a plurality of photosensitive units, each including a selective light director 310 and a photoelectric converter 410, and a dedicated light source 220. The light source 220, the photoelectric converters 410, and the pixel units R, and B are arranged on the first surface S1 of the selective light guider 310. In the example shown in FIG. 9B, the photoelectric converters 410 and the pixel units R, and B are alternately arranged around the light source 220, although the present disclosure is not limited thereto. Advantageously, due to the use of the dedicated light source 220, the photosensitive module 930 shown in FIG. 9B does not include collimators. It will be understood that the arrangement of the selective light director 310, the photoelectric converters 410, the light source 220, and the pixel units R, and B are exemplary and illustrative in FIG. 9B, and that more selective light directors 310, photoelectric converters 410, light sources 220, and/or pixel units R, and B may be provided in other embodiments.

Figure 9C:
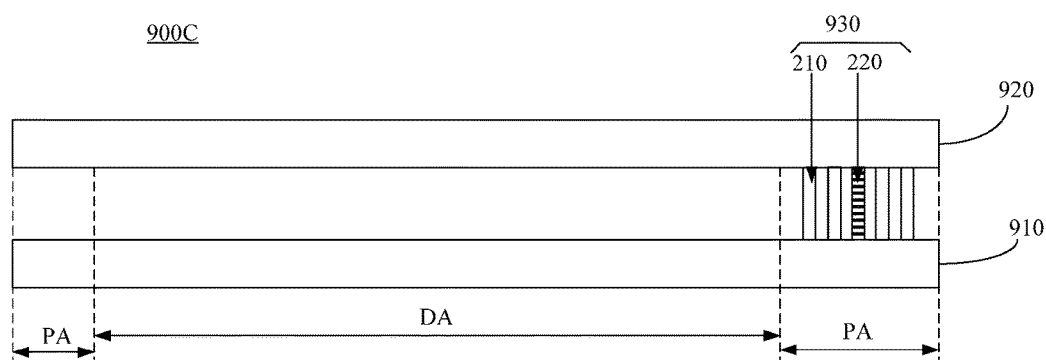
FIG. 9C is a cross-sectional view of a display panel according to an embodiment of the present disclosure.

FIG. 9C is a sectional view of a display panel 900C according to an embodiment of the present disclosure. The display panel 900C is different from the display panel 900A in that the photosensitive module 930 is now disposed in the non-display area PA between the base substrate 910 and the cover 920. As an example, in a scenario where the display panel 900C is used for a smart phone, the photosensitive module 930 can be disposed beneath the home key for fingerprint recognition. The present disclosure is not so limited. In the embodiment of FIG. 9C, the photosensitive module 930 is provided with a dedicated light source 220. The use of the dedicated light source can provide advantages as described earlier.

Figure 10:
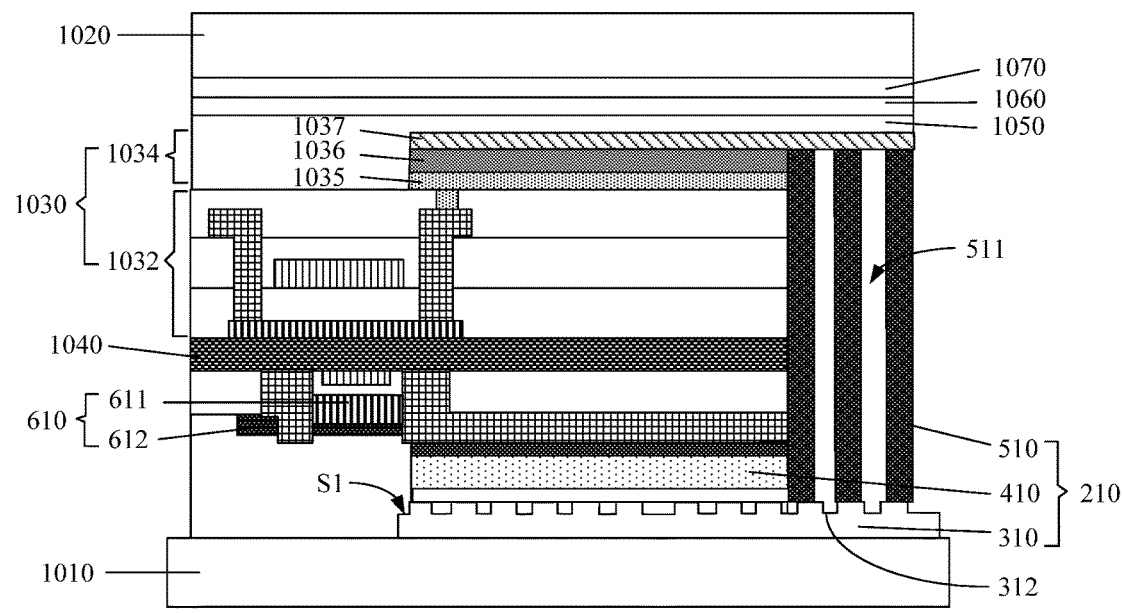
FIG. 10 is a partial cross-sectional view of a display panel according to an embodiment of the present disclosure.

FIG. 10 is a partial cross-sectional view of a display panel 1000 according to an embodiment of the present disclosure. As shown in FIG. 10, the display panel 1000 includes a base substrate 1010 and a cover plate 1020 disposed opposite to the base substrate 1010. The display panel 1000 further includes a plurality of pixel units (only one of them is shown in FIG. 10, denoted as 1030) disposed in a display area between the base substrate 1010 and the cover 1020, and a photosensitive module according to an embodiment of the present disclosure (only one photosensitive cell of the photosensitive module is shown, denoted as 210).

The pixel unit 1030 includes a pixel driving circuit 1032 and an organic light emitting diode 1034 electrically connected to the pixel driving circuit 1032. The organic light emitting diode 1034 includes a first electrode layer 1035, an organic light emitting material layer 1036, and a second electrode layer 1037 stacked on top of each other in a direction away from the base substrate 1010. Although the photosensitive cell 210 takes the form as shown in FIG. 5, including the selective light director 310, the photoelectric converter 410, and the collimator 510, the present disclosure is not limited thereto. The pixel unit 1030 is disposed above the photosensitive cell 210 such that the organic light emitting diode 1034 emits light in a direction away from the first surface S1 of the selective light director 310. Therefore, the organic light emitting diode 1034 can serve as a light source of the photosensitive module. In this regard, the pixel unit 1030 may be referred to as a multiplexed pixel unit because it is used not only for displaying images but also for providing light for the photosensitive module. It will be understood that it is not necessary that each of the pixel units of the display panel 1000 is "multiplexed", and that it is not necessary to provide a multiplexed pixel unit 1030 on each of the photosensitive cells 210 of the display panel 1000. It will also be understood that although not shown in FIG. 10, one or more dedicated light sources may be provided in the photosensitive module, for example, on the first surface S1 of the selective light director 310 or on the pixel driving circuit 1032. The use of the dedicated light source can provide advantages as described earlier.

In the example of FIG. 10, the display panel 1000 further includes an insulating layer 1040 disposed between the multiplexed pixel unit 1030 and the corresponding photosensitive cell 210, and the photosensitive cell 210 further includes a switch transistor 610 via which the photosensitive cell 210 is connected to a processor (not shown in FIG. 10). The selective light director 310, the photoelectric converter 410, and the switch transistor 610 of the photosensitive cell 210 are each disposed between the insulating layer 1040 and the base substrate 1010. The switch transistor 610 is disposed on the side of the photoelectric converter 410 away from the selective light director 310. The switch transistor 610 includes an active layer 611 and a light shielding block 612 that covers the active layer 611 to protect the active layer 611 from light exiting from the selective light director 310. Specifically, the light shielding block 612 is disposed on the side of the switch transistor 610 close to the photoelectric converter 410. This protects the active layer 611 of the switch transistor 610 from a change in characteristics due to illumination from below. In addition, an orthographic projection of the active layer 611 on the base substrate 1010 may be within an orthogonal projection of a non-transparent region (e.g., a gate region of the pixel driving circuit 1032) in the pixel driving circuit 1032 on the base substrate 1010. This protects the active layer 611 from a change in characteristics due to illumination from above. The collimator 510 is arranged such that its light transmission channel 511 extends from the first holographic diffraction grating 312 of the selective light director 310 up to the second electrode layer 1037 of the organic light emitting diode 1034. This provides the collimator 510 with improved collimation performance in that the light transmission channel 511 is elongated so that the cluttered light is more fully absorbed and cannot reach the first holographic diffraction grating 312. Continuing with reference to FIG. 10, between the cover plate 1020 and the organic light emitting diode 1034, a thin film encapsulation layer 1050, a polarizer 1060, and an optically clear adhesive 1070 may be provided, which are known and thus will not be described in detail herein.

Figure 11:
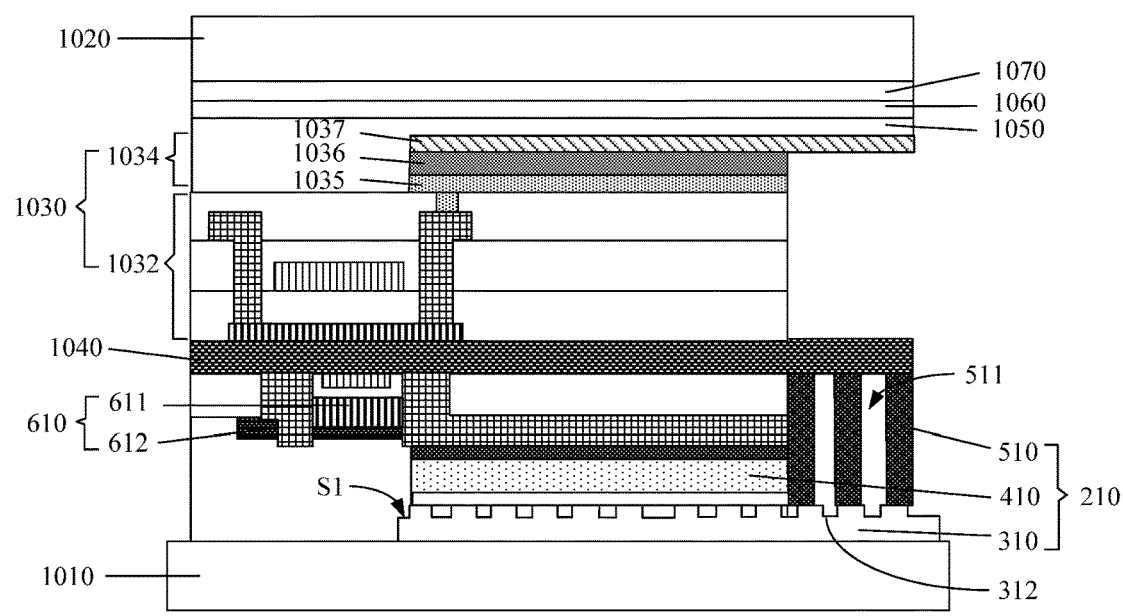
FIG. 11 is a partial cross-sectional view of a display panel according to an embodiment of the present disclosure.

FIG. 11 is a partial cross-sectional view of a display panel 1100 according to an embodiment of the present disclosure. The display panel 1100 is different from the display panel 1000 in that the light transmission channel 511 of the collimator 510 now extends from the first holographic diffraction grating 312 to only the insulating layer 1040. This provides the photosensitive cell 210 with convenience in design and manufacture. For example, the configuration of the photosensitive cell 210 may remain unchanged irrespective of the presence or absence of the multiplexed pixel unit 1030. In the example of FIG. 11, the insulating layer 1040 may be made of glass or any other suitable transparent material.

In the embodiments shown in FIGS. 10 and 11, the multiplexed pixel unit 1030 may have a relatively large area (relative to a non-multiplexed pixel unit), and thus the photoelectric converter 410 of the photosensitive cell 210 may have a large light receiving area. With the same light intensity, the larger the light receiving area, the stronger the intensity of the electrical signal output by the photoelectric converter 410. Therefore, the photosensitive module can output a strong electrical signal, thus improving the accuracy of image recognition. Moreover, in the embodiments shown in FIGS. 10 and 11, since the photosensitive module is disposed in the display area of the display panel, "under-screen fingerprint recognition" can be achieved. By way of example and not limitation, the sum of the thicknesses of the photoelectric converter 410 and the selective light director 310 in the photosensitive cell 210 may be less than 100 microns, and the distance between the side of the cover plate 1020 far from the photosensitive cell 210 and the side of the collimator 510 in the photosensitive cell 210 close to the cover plate 1020 may be 1 mm.

The foregoing is only illustrative embodiments of the present disclosure and should not be construed as limiting of the present disclosure. Various modifications, substitutions and variations can be made by those of ordinary skill in the art without departing from the scope of the present disclosure. Therefore, the scope of this disclosure is subject to the appended claims.

What is claimed is:

1. A photosensitive module comprising:
    a plurality of photosensitive cells each comprising:
        a selective light director having a first surface, the first surface comprising a light entry region and a light exit region different from the light entry region, the selective light director being configured to selectively direct a collimated portion of light incident towards the light entry region to the light exit region to exit from the selective light director, the collimated portion of the light having an incidence angle with respect to a normal to the first surface that is less than a threshold; and
        a photoelectric converter arranged in the light exit region and having a light receiving surface facing the light exit region to receive the collimated portion of the light exiting from the selective light director, the photoelectric converter being configured to generate an electrical signal based on an intensity of the received collimated portion of the light.

2. The photosensitive module of claim 1, further comprising a light source arranged on the first surface of one of the selective light directors to emit light in a direction away from the first surface.

3. The photosensitive module of claim 1, further comprising a processor configured to receive the electrical signal from at least a portion of the photosensitive cells and generate an image from the received electrical signals.

4. The photosensitive module of claim 1, wherein the selective light director comprises:
    an optical waveguide plate providing the first surface;
    a first holographic diffraction grating arranged in the light entry region for coupling the collimated portion of the light into the optical waveguide plate such that the collimated portion of the light propagates within the optical waveguide plate to the light exit region; and
    a second holographic diffraction grating arranged in the light exit region for coupling the collimated portion of the light propagating to the light exit region out of the optical waveguide plate.

5. The photosensitive module of claim 4, wherein each of the photosensitive cells further comprises a collimator comprising at least one light transmission channel, and wherein the collimator is arranged on the first holographic diffraction grating to allow substantially only the collimated portion of the light incident towards the light entry region to pass through the at least one light transmission channel to be incident on the first holographic diffraction grating.

6. The photosensitive module of claim 5, wherein the collimator comprises a plurality of light absorbing strips parallel to and spaced apart from one other, and wherein the light absorbing strips are arranged parallel to the normal to the first surface such that a gap between each two directly adjacent ones of the light absorbing strips forms a corresponding one of the light transmission channels.

7. The photosensitive module of claim 5, wherein the collimator comprises a first light absorbing plate and a second light absorbing plate parallel to and spaced apart from each other, wherein the first light absorbing plate and the second light absorbing plate are arranged perpendicular to the normal to the first surface and are each provided with at least one opening extending in a direction parallel to the normal, and wherein the at least one opening of the first light absorbing plate and the at least one opening of the second light absorbing plate are aligned in a direction parallel to the normal to form the at least one light transmission channel.

8. The photosensitive module of claim 4, wherein at least a portion of the plurality of photosensitive cells is formed in one piece.

9. The photosensitive module of claim 4, wherein the selective light directors of the plurality of photosensitive cells are spaced apart from one another.

10. The photosensitive module of claim 1, wherein the photoelectric converter is provided, at an outer surface thereof other than the light receiving surface, with a light shielding layer.

11. The photosensitive module of claim 1, wherein each of the photosensitive cells further comprises a switch transistor arranged on a side of the photoelectric converter away from the selective light director.

12. The photosensitive module of claim 11, wherein the switch transistor comprises an active layer and a light shielding block covering the active layer to protect the active layer from the collimated portion of the light exiting from the selective light director.

13. A photosensitive device comprising the photosensitive module of claim 1.

14. A display panel comprising:
a base substrate on which a plurality of pixel units are provided;
a cover plate disposed opposite to the base substrate; and
a photosensitive module disposed between the base substrate and the cover plate, the photosensitive module comprising a plurality of photosensitive cells each comprising:
a selective light director having a first surface, the first surface comprising a light entry region and a light exit region different from the light entry region, the selective light director being configured to selectively direct a collimated portion of light incident towards the light entry region to the light exit region to exit from the selective light director, the collimated portion of the light having an incidence angle with respect to a normal to the first surface that is less than a threshold; and
a photoelectric converter arranged in the light exit region and having a light receiving surface facing the light exit region to receive the collimated portion of the light exiting from the selective light director, the photoelectric converter being configured to generate an electrical signal based on an intensity of the received collimated portion of the light,
wherein the photosensitive module is arranged such that the first surface of the selective light director faces the cover plate.

15. The display panel of claim 14, wherein the photosensitive module further comprises a light source configured to emit light in a direction away from the first surface of the selective light director.

16. The display panel of claim 15, wherein the photosensitive module is disposed within a display area of the display panel where the pixel units are provided, and wherein the light source, the pixel units and the photoelectric converters are arranged on the first surfaces of the selective light directors.

17. The display panel of claim 14, wherein the photosensitive module is disposed within a display area of the display panel where the pixel units are provided, wherein each of the pixel units is an organic light emitting diode pixel unit comprising an organic light emitting diode, and wherein first ones of the pixel units are disposed above respective ones of the photosensitive cells such that the organic light emitting diodes of the first pixel units emit light in a direction away from the first surfaces of the selective light directors.

18. The display panel of claim 17, wherein the selective light director comprises:
an optical waveguide plate providing the first surface;
a first holographic diffraction grating arranged in the light entry region for coupling the collimated portion of the light into the optical waveguide plate such that the collimated portion of the light propagates within the optical waveguide plate to the light exit region; and
a second holographic diffraction grating arranged in the light exit region for coupling the collimated portion of the light propagating to the light exit region out of the optical waveguide plate.

19. The display panel of claim 18, wherein the selective light director further comprises a collimator comprising at least one light transmission channel, and wherein the collimator is arranged on the first holographic diffraction grating to allow substantially only the collimated portion of the light incident towards the light entry region to pass through the at least one light transmission channel to be incident on the first holographic diffraction grating.

20. The display panel of claim 19, further comprising an insulating layer disposed between the first pixel units and the respective photosensitive cells, wherein the organic light emitting diode comprises a first electrode layer, an organic light emitting material layer, and a second electrode layer stacked on top of each other in a direction far away from the base substrate, and wherein the at least one light transmission channel extends from the first holographic diffraction grating to one selected from the group consisting of the second electrode layer and the insulating layer.

* * * * *